United States Patent
Ohuchi et al.

(10) Patent No.: US 6,349,395 B2
(45) Date of Patent: *Feb. 19, 2002

(54) CONFIGURABLE INTEGRATED CIRCUIT AND METHOD OF TESTING THE SAME

(75) Inventors: Kazunori Ohuchi; Masako Yoshida; Yukihito Oowaki, all of Kanagawa; Hiroshige Fujii; Masatoshi Sekine, both of Tokyo, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/154,027

(22) Filed: Sep. 16, 1998

(30) Foreign Application Priority Data

Sep. 17, 1997 (JP) .............................. 9-252472
Sep. 17, 1997 (JP) .............................. 9-252473

(51) Int. Cl.⁷ .............................................. G01R 31/28
(52) U.S. Cl. ..................... 714/724; 714/725; 324/158.1
(58) Field of Search ................................ 714/724, 725; 324/158.1

(56) References Cited

U.S. PATENT DOCUMENTS

| | | | | |
|---|---|---|---|---|
| 4,695,740 A | | 9/1987 | Carter ........................ 307/425 |
| 5,336,950 A | * | 8/1994 | Popli et al. ................. 307/465 |
| 5,432,441 A | * | 7/1995 | El-Ayat et al. ........... 324/158.1 |
| 5,481,696 A | * | 1/1996 | Lomp et al. ................. 395/500 |
| 5,991,907 A | * | 11/1999 | Stroud et al. ............... 714/725 |
| 6,003,150 A | * | 12/1999 | Stroud et al. ............... 714/725 |
| 6,069,489 A | * | 5/2000 | Iwanczuk et al. ............. 326/40 |

FOREIGN PATENT DOCUMENTS

| | | | |
|---|---|---|---|
| EP | 0497029 | * | 8/1992 |
| JP | 6-90597 | | 11/1994 |
| WO | 9938071 | * | 7/1999 |

OTHER PUBLICATIONS

Ethan Mirsky, et al., IEEE Symposium on FPGAs for Custom Computing Machines. "Matrix: a Reconfigurable Computing Architecture with Configurable Instruction Distribution and Deployable Resources", Apr. 17–19, 1996.

* cited by examiner

Primary Examiner—Emmanuel L. Moise
(74) Attorney, Agent, or Firm—Oblon, Spivak, McClelland, Maier & Neustadt, P.C.

(57) ABSTRACT

An integrated circuit has configurable logic blocks that are reconfigurable, hard-wired logic blocks that carry out fixed operations, and a memory. The memory stores configuration data for configuring the configurable logic blocks, block-connection data for determining connections between the configurable and hard-wired logic blocks, and partial-circuit-connection data for determining connections between partial circuits each of which consists of logic blocks selected among the configurable and hard-wired logic blocks. These pieces of data are shared by the logic blocks to reduce the number of memories in the integrated circuit and improve the packaging density of the integrated circuit.

16 Claims, 12 Drawing Sheets

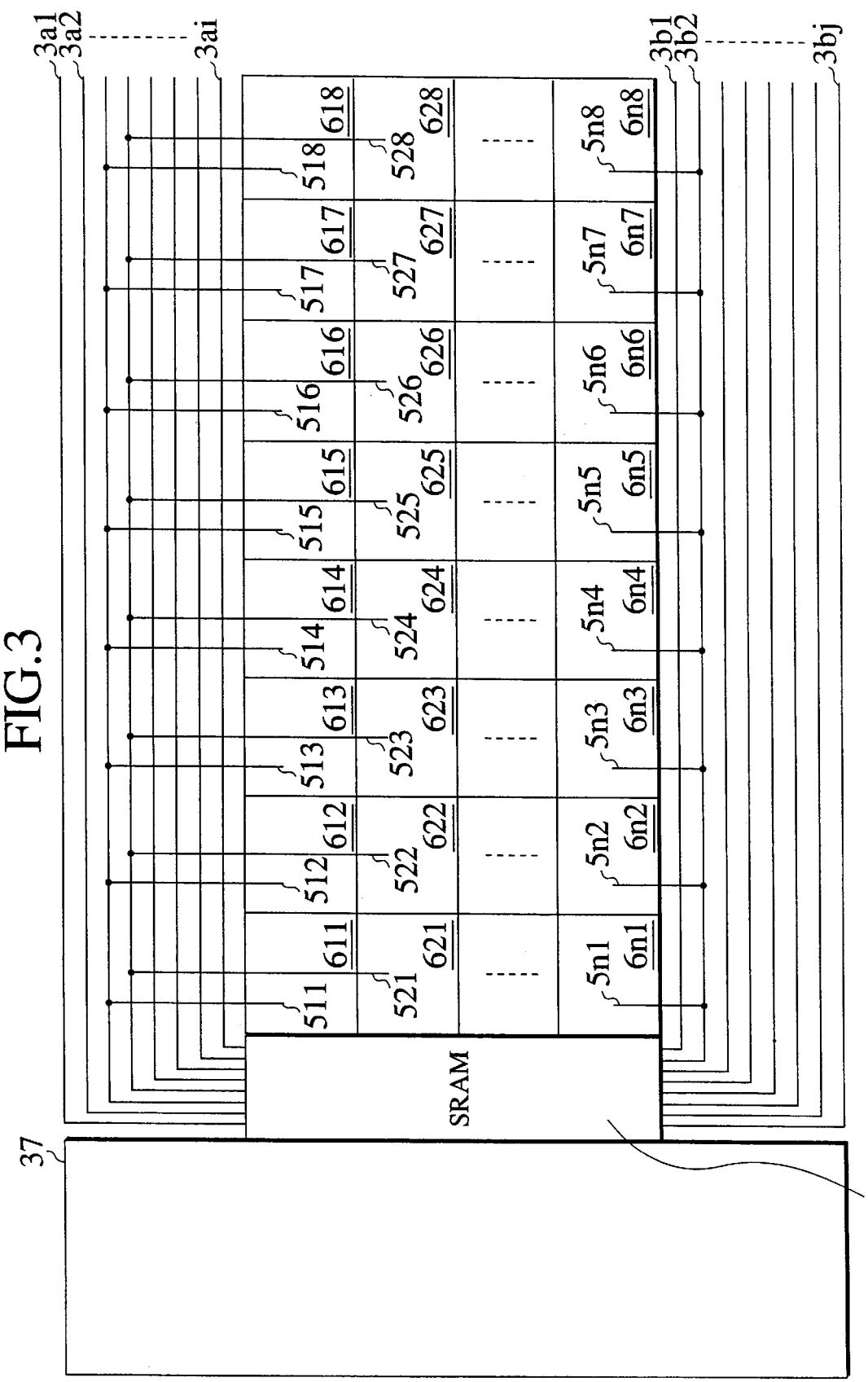

$f_K(\alpha, \beta)$

CONFIGURABLE INTEGRATED CIRCUIT AND METHOD OF TESTING THE SAME

BACKGROUND OF THE INVENTION

1. Field of the Invention

The present invention relates to an integrated circuit and a method of testing the same. In particular, the present invention relates to an integrated circuit having configurable logic blocks (CLBs) that are configurable according to external signals and a method of testing such an integrated circuit.

2. Description of the Related Art

Integrated circuits having CLBs that are configurable according to external signals are flexible to use, and therefore, their demand is increasing.

The integrated circuits having CLBs, however, involve low packaging density and slow operation speed. Accordingly, they have never been used in fields where high packaging density and high operation speed are important.

FIG. 1A roughly shows a CLB 1 and a CLB memory 3 according to a prior art. The CLB memory 3 stores data for configuring the CLB 1. The prior art provides each CLB with a CLB memory. If many CLBs each having a CLB memory are installed in an integrated circuit, the CLB memories occupy a large area in the integrated circuit.

FIGS. 2A and 2B show an example of the structure of a CLB according to a prior art. The CLB consists of 2- or 4-input multiplexers (MUXs) 21, 23, 25, 27, and 29. Each of the 2-input multiplexers receives a selection signal to select one of two inputs and outputs the selected one. Each of the 4-input multiplexers receives two selection signals to select one of four inputs and outputs the selected one.

The multiplexers are connected to one another, and the selection signals are changed so that the multiplexers may realize the function of a logic block such as an AND, NAND, OR, NOR, or EXOR logic block.

The selection signals to the multiplexers and connection lines between the multiplexers are programmable according to configuration data stored in the CLB memory 3. Namely, the CLB memory 3 must have all data necessary for selecting inputs to the multiplexers 21 to 29 and determining connections between the multiplexers. As a result, the CLB memory 3 needs a large area.

The integrated circuits having CLBs are optionally configurable by a user, and therefore, are advantageous in shortening a development period of electronic devices that involves trial and error and functional modifications. The integrated circuits having CLBs are also applicable to electronic devices that are manufactured in small quantities. Some integrated circuits having CLBs allow a user to configure some CLBs without affecting other CLBs that are operating.

In contrast with the CLBs that have the above-mentioned problems of low packaging density and slow operation speed, hard-wired logic blocks (HLBs) consisting of fixed elements and wires achieve high packaging density. For example, an HLB serving as a 2-input NAND gate is made of only four transistors. On the other hand, a CLB serving as a 2-input NAND gate must have many multiplexers and inverters as shown in FIG. 2A. In addition, the CLB must have a CLB memory. It is said that the packaging density of CLBs is one tenth or below of that of HLBs.

In connection with the operation speed, the HLB serving as a 2-input NAND gate involves a single gate stage to pass signals therethrough. On the other hand, the CLB of FIG. 2 involves many multiplexers and inverters to pass signals therethrough, to elongate a signal transmission time. It is said that the operation speed of CLBs is one tenth or less of that of HLBs.

Due to these problems, it is difficult to apply CLBs to fields where packaging density and operation speed are important.

Another problem of CLBs is difficulty in testing them because they are configurable. FIG. 1B shows a method of testing a CLB according to a prior art. The CLB is a reconfigurable function unit (RFU) that is configured according to external data S0 into, for example, a parallel multiplier. Data X and Y for a multiplication are supplied to the RFU, which provides a resultant output Z. The output Z is examined by a tester to determine whether or not the RFU is sound.

This testing method needs a large number of combinations of input vectors X and Y and many output pins to verify each output Z. When verifying the output Z, the tester must secure high-speed operation corresponding to the internal operation frequencies of the RFU. These factors complicate the testing of CLBs.

SUMMARY OF THE INVENTION

An object of the present invention is to improve the packaging density and operation speed of an integrated circuit having CLBs that are configurable according to external signals, and make the testing of the integrated circuit easier.

In order to accomplish the objects., the present invention provides an integrated circuit having CLBs that share configuration data stored in a configuration memory, to reduce the number of configuration memories and improve packaging density.

The present invention employs, if possible, HLBs to improve the packaging density and operation speed of the integrated circuit.

The present invention reconfigures connections among the CLBs and HLBs according to block-connection data. The present invention connects the CLBs and HLBs to form logic-block sets that share block-connection data, thereby reducing the number of memories necessary for storing block-connection data and improving the packaging density.

The present invention may combine the logic-block sets into partial circuits whose connections are reconfigurable.

The present invention symmetrically arranges CLBs with respect to a CLB memory, to equalize the lengths of wires to the CLBs.

The present invention provides CLBs with the same configuration data and the same test data and compares operation results provided by the CLBs with one another, to easily test the CLBs.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing the invention in practice.

BRIEF DESCRIPTION OF THE DRAWINGS

FIG. 3 shows an integrated circuit having CLBs according to a first embodiment of the present invention;

DETAILED DESCRIPTION OF THE EMBODIMENTS

Integrated circuits and methods of testing an integrated circuit according to the embodiments of the present invention will be explained with reference to the accompanying drawings.

FIG. 3 shows an integrated circuit according to the first embodiment of the present invention. The integrated circuit has configurable logic blocks (CLBS) 611 to 6n8, an SRAM 31, and a controller 37. The SRAM 31 holds configuration data for configuring the CLBs 611 to 6n8. These CLBs share the configuration data stored in the SRAM 31.

Under the control of the controller 37, the configuration data stored in the SRAM 31 is supplied to the CLBs 611 to 6n8 through lines 3a1 to 3ai, 3b1 to 3bj, and 511 to 5n8.

CLBs that receive the same configuration data provide each the same function. For example, the CLBs 611 to 618 receive the same configuration data through the lines 3a3 and 511 to 518. If the configuration data is to make a CLB an OR logic block, the CLBs 611 to 618 will be each an OR logic block.

Each CLB processes one-bit data. Namely, the CLBs 611 to 618 process 8-bit data. If there are 8-bit data A of bits a1 to a8 and 8-bit data B of bits b1 to b8 and if an operation of "A+B" is carried out on the data, the bits a1 and b1 are successively supplied to the CLB 611, to carry out an operation of "a1+b1." Similarly, the bits a2 to a8 and b2 to b8 are supplied to the CLBs 612 to 618, to carry out operations of "a2+b2" to "a8+b8."

Similarly, the CLBs 621 to 628 serve each as the same logic block, such as an exclusive OR (EXOR) logic block.

Unlike the prior art that stores identical configuration data in each of separate memories provided for CLBs that carry out the same operation, the first embodiment stores configuration data in a single memory, to reduce the number of memories and improve the packaging density of CLBs.

The first embodiment supplies the same configuration data from the SRAM 31 to eight CLBs such as the CLBs 611 to 618. This reduces the number of memories and an area occupied by memories to one eighth of the prior art.

If the ratio of an area occupied by operational elements such as multiplexers and inverters to an area occupied by an SRAM in an integrated circuit is 50:50, the first embodiment reduces the SRAM area to one eighth of the prior art and the total of the element area and SRAM area to 56% of the prior art.

Although not shown, the integrated circuit of FIG. 3 has registers for storing data to process and results of intermediate operations and data lines for connecting the registers to the operational elements.

Figure 1A:
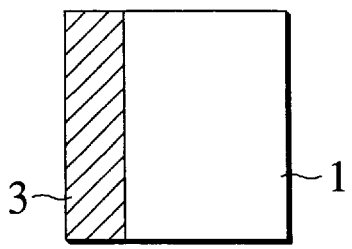
FIG. 1A roughly shows a CLB and a CLB memory according to a prior art.
Figure 1B:
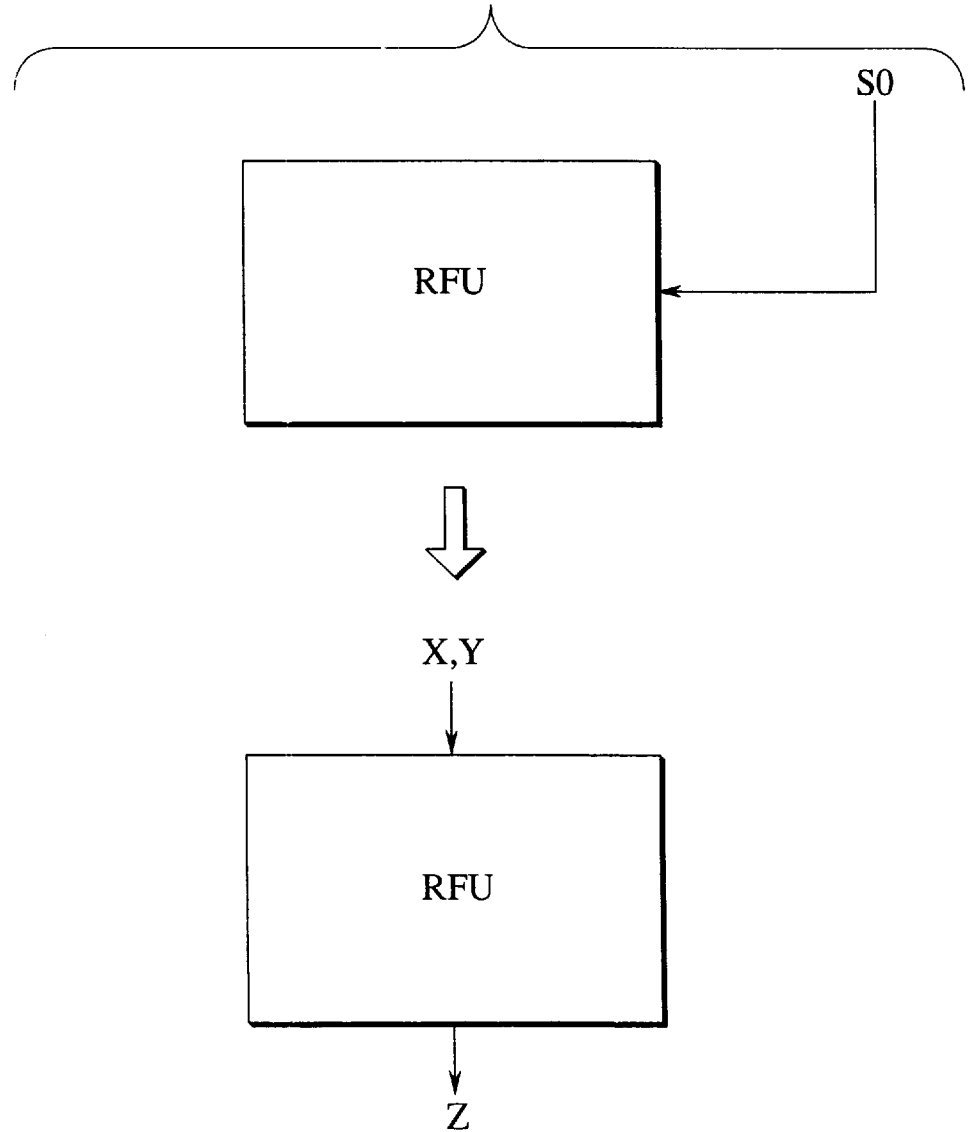
FIG. 1B shows a method of testing a CLB according to a prior art.
Figure 2A:
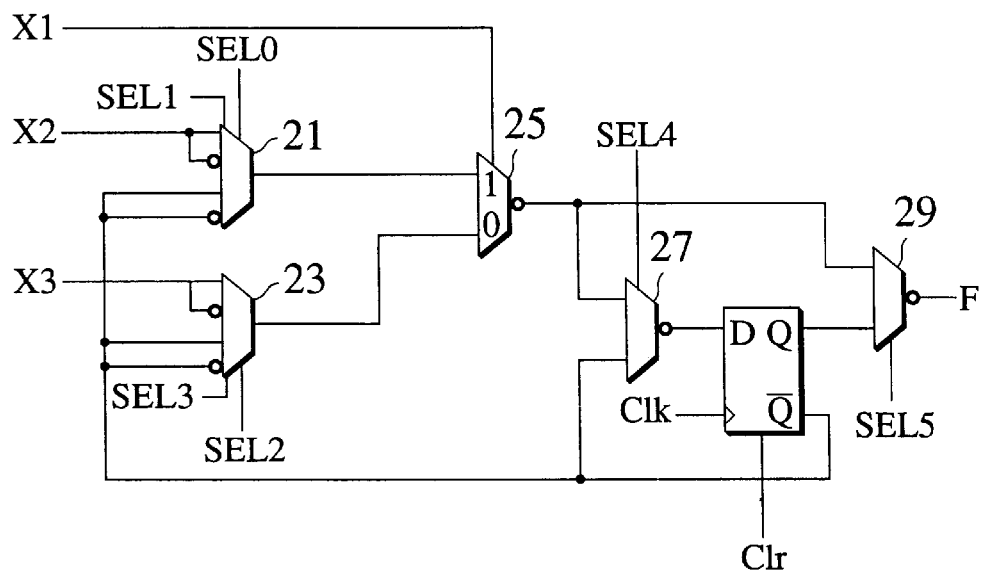
FIGS. 2A and 2B show the structure of a CLB according to a prior art.
Figure 2B:
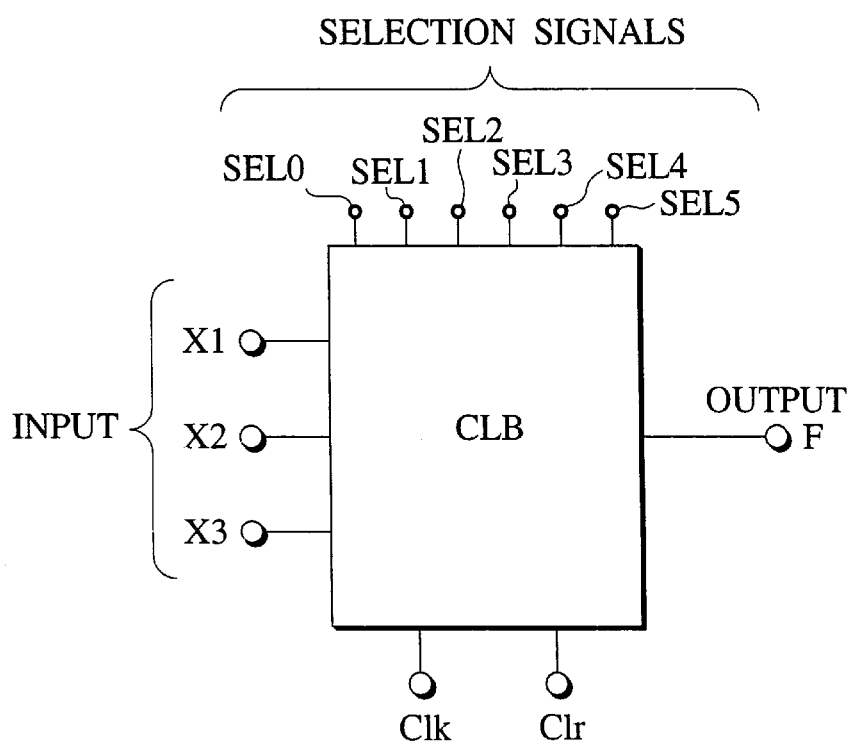
Figure 4:
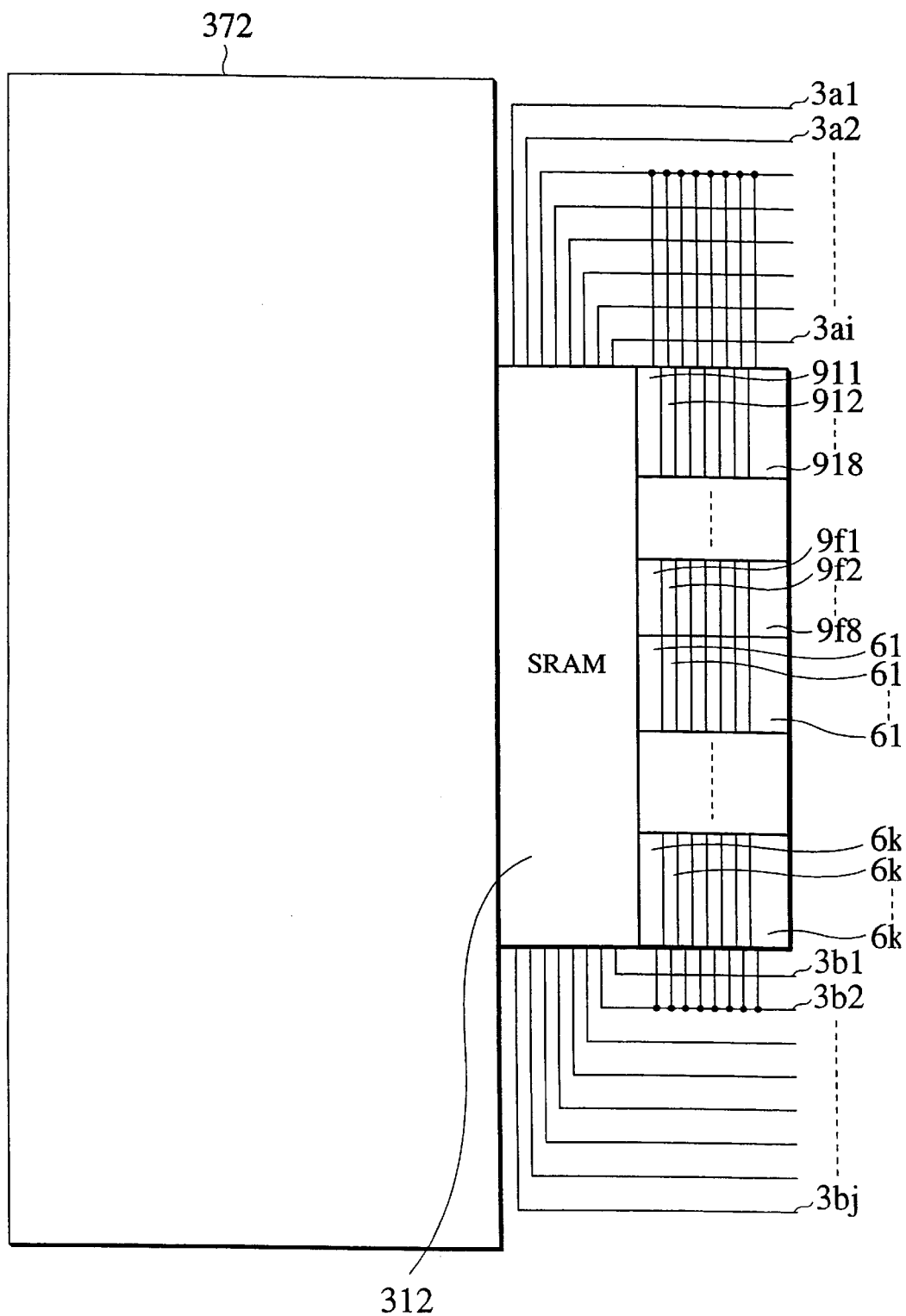
FIG. 4 shows an integrated circuit having CLBs and HLBs according to a second embodiment of the present invention.

FIG. 4 shows an integrated circuit according to the second embodiment of the present invention. The integrated circuit has configurable logic blocks (CLBs) 611 to 6k8, hard-wired logic blocks (HLBs) 911 to 9f8, an SRAM 312, and a controller 372. The SRAM 312 stores configuration data for configuring the CLBs and block-connection data for determining connections among the CLBs and HLBs.

The HLBs 911 to 9f8 have fixed functions. Unlike the CLBs, the HLBs are unable to change their functions according to configuration data. For example, an HLB to which an exclusive OR function is assigned serves only as an exclusive OR logic block.

It is possible, however, to change connections between the HLBs, between the CLBs, and between the CLBs and the HLBs. For example, the output of the HLB 911 is connected to an input of the CLB 6k1, and the output of the CLB 6k1 to an input of the HLB 9f1. Without using the CLB, it is possible to connect the output of the HLB 911 to an input of the HLB 9f1.

Operations carried out by the CLBs may be taken over by HLBs. If possible, all operations may be executed by HLBs. Namely, the CLBs may partly or entirely be replaced with HLBs.

The size of HLB may be as small as an AND circuit, intermediate-size like an Adder circuit, or as large as an Arithmetic and Logic Unit.

Although the HLBs 911 to 9f8 and the CLBs 611 to 6k8 have the same size in FIG. 4, the HLBs are actually smaller than the CLBs. Accordingly, partly or entirely replacing the CLBs with HLBs improves the packaging density of the integrated circuit.

Since HLBs have higher processing speed than CLBs, partly or entirely replacing the CLBs with HLBs improves the processing speed of the integrated circuit.

The CLBs and HLBs may be connected to form logic-block sets each to carry out a series of operations. For example, the HLBs 911 and 9f1 and the CLBs 611 and 6k1 are connected to form a logic-block set. Similarly, the HLBs 918 and 9f8 and the CLBs 618 and 6k8 are connected to form another logic-block set. The logic-block sets carry out the same series of operations. Namely, the logic-block sets must have the same combination of logic blocks that are connected in the same manner because the CLBs 611 to 618 receive the same configuration data, i.e., every eight CLBs share the same configuration data stored in the SRAM 312. This arrangement reduces the number of configuration data memories to one eighth of the prior art. To make the logic-block sets execute the same series of operations, the logic blocks must be connected in the same manner in every logic-block set. This means that the same block-connection data held in the SRAM 312 is shared by the eight logic-block sets. This reduces the number of block-connection-data memories to one eighth of the prior art, thereby improving the packaging density of the integrated circuit.

Figure 5:
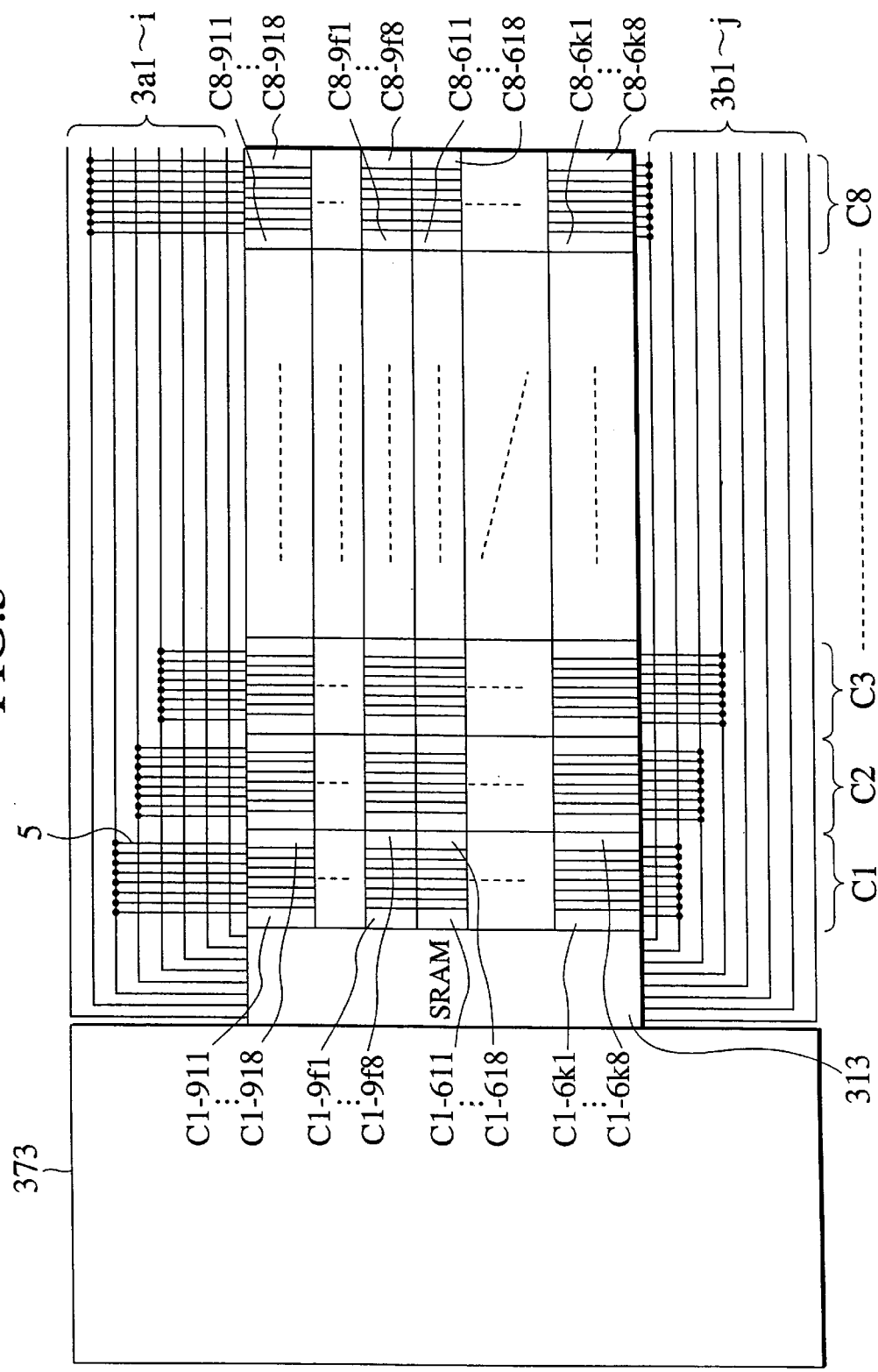
FIG. 5 shows an integrated circuit having CLBs and HLBs according to a third embodiment of the present invention.

FIG. 5 shows an integrated circuit according to the third embodiment of the present invention. The integrated circuit has CLBs C1-6l1 to C8-6k8, HLBs C1-9l1 to C8-9f8, an SRAM 313, and a controller 373. The SRAM 313 stores configuration data for configuring the CLBs, and block-connection data for determining connections among the CLBs and HLBs. The SRAM 313 or the controller 373 stores partial-circuit-connection data for determining connections between partial circuits consisting of logic blocks.

Operations carried out by the CLBs may be taken over by HLBs. If possible, all operations may be executed by HLBs. Namely, the CLBs may partly or entirely be replaced with HLBs.

The size of HLB may be as small as an AND circuit, intermediate-sized like an Adder circuit, or as large as an Arithmetic and Logic Unit.

Under the control of the controller 373, the block-connection data configures connections between the CLBs, between the HLBs, and between the CLBs and the HLBs. For example, a partial circuit C1 for carrying out a series of operations is formed with an HLB for executing an exclusive OR operation as a first step, an HLB for executing an add operation as a second step, and a CLB for executing a cyclic shift operation as a third step. Partial circuits C1 to C8 are formed to carry out operation series that may be different from or same with one another.

Connections between the partial circuits C1 to C8 are reconfigured according to the partial-circuit-connection data. For example, the output of the partial circuit C1 is connected to an input of the partial circuit C2, the output of the partial circuit C2 to an input of the partial circuit C3, and the output of the partial circuit C3 to an input of the partial circuit C5. In this way, partial circuits that are not adjacent to each other may be connected to each other. It is possible to connect the output of the partial circuit C1 to an input of the same, to repeatedly use the same partial circuit several times.

Under the control of the controller 373, 8-bit data is supplied to, for example, the partial circuit C1, and the partial circuit C1 carries out the predetermined series of operations on the data. Resultant data from the partial circuit C1 is supplied to an input of the partial circuit C2.

An integrated circuit according to the fourth embodiment of the present invention will be explained. This integrated circuit serves as an encryption processing circuit. There are many encryption processing algorithms. One of them is FEAL-8 developed by NTT Corporation, which is disclosed in Japanese Examined Patent Publication No. 6-90597.

Figure 6:
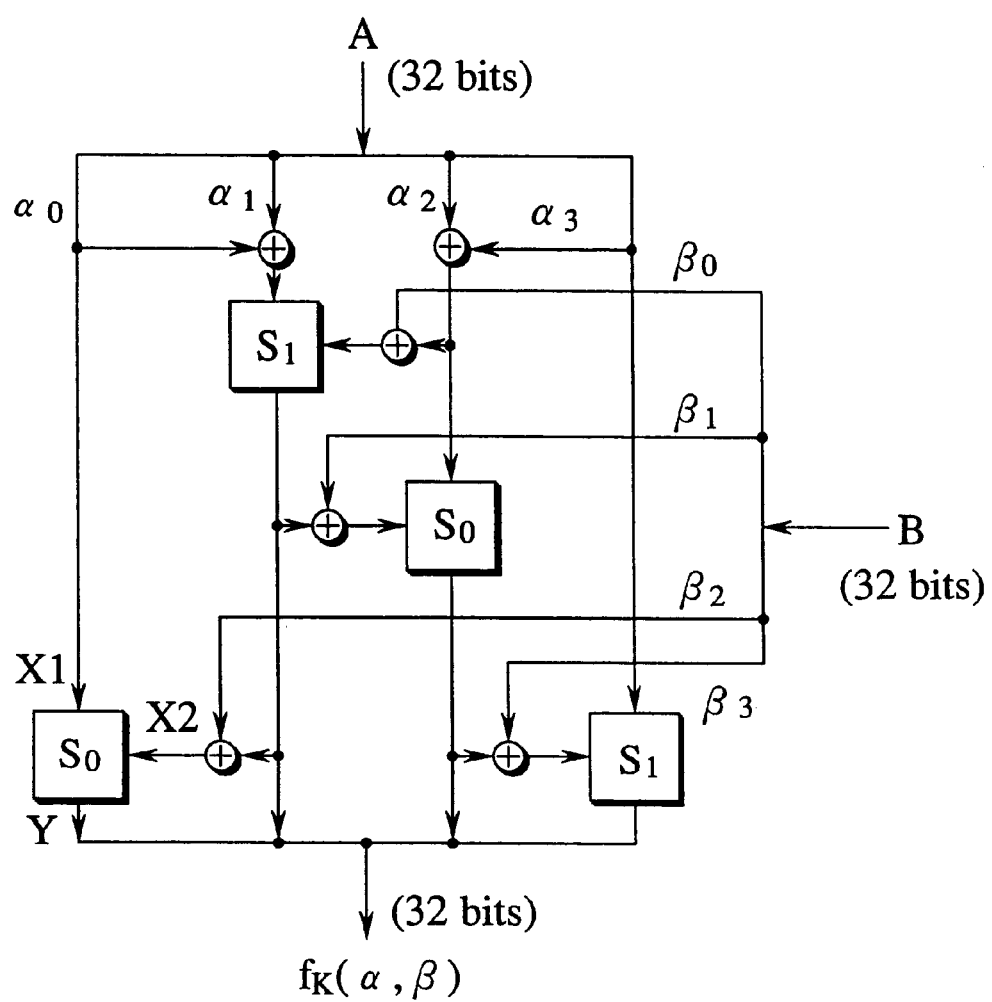
FIG. 6 shows a function-fk unit in a key processing flow realized in an integrated circuit according to a fourth embodiment of the present invention.
Figure 7:
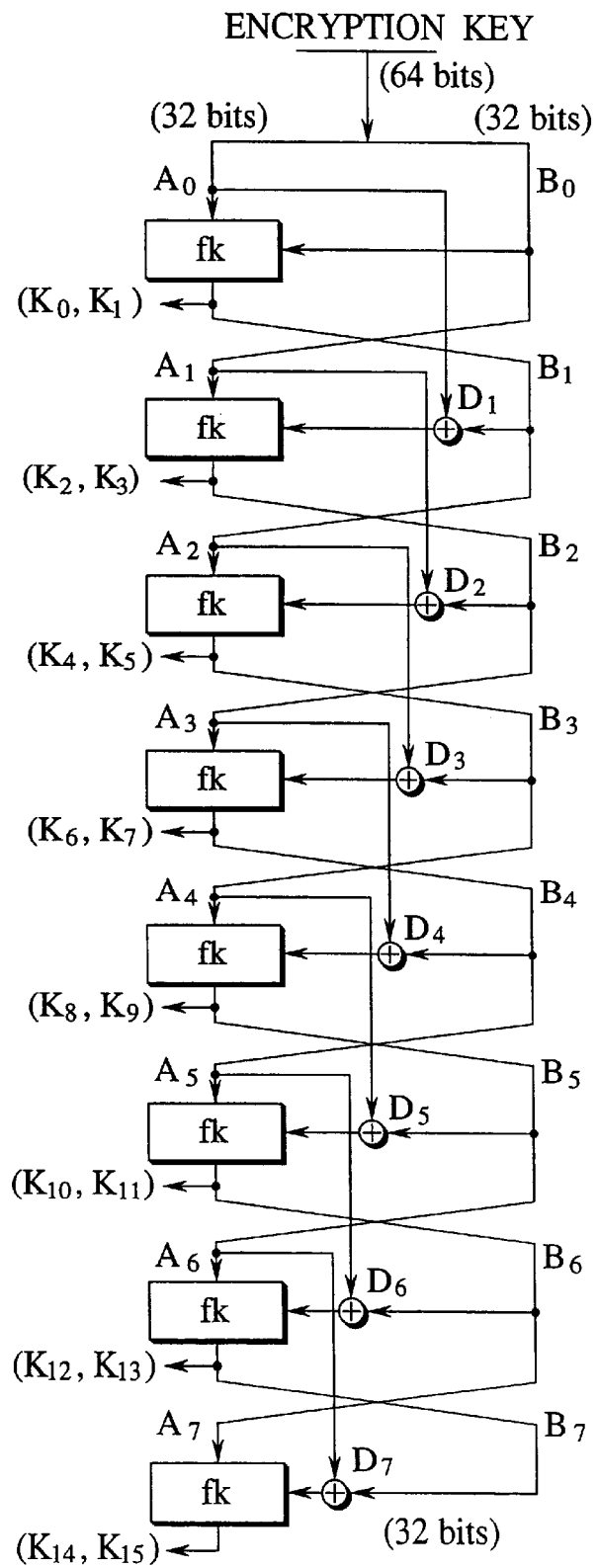
FIG. 7 shows the key processing flow involving function-fk units each being equivalent to the function-fk unit of FIG. 6, for creating an expanded key from an encryption key.
Figure 8:
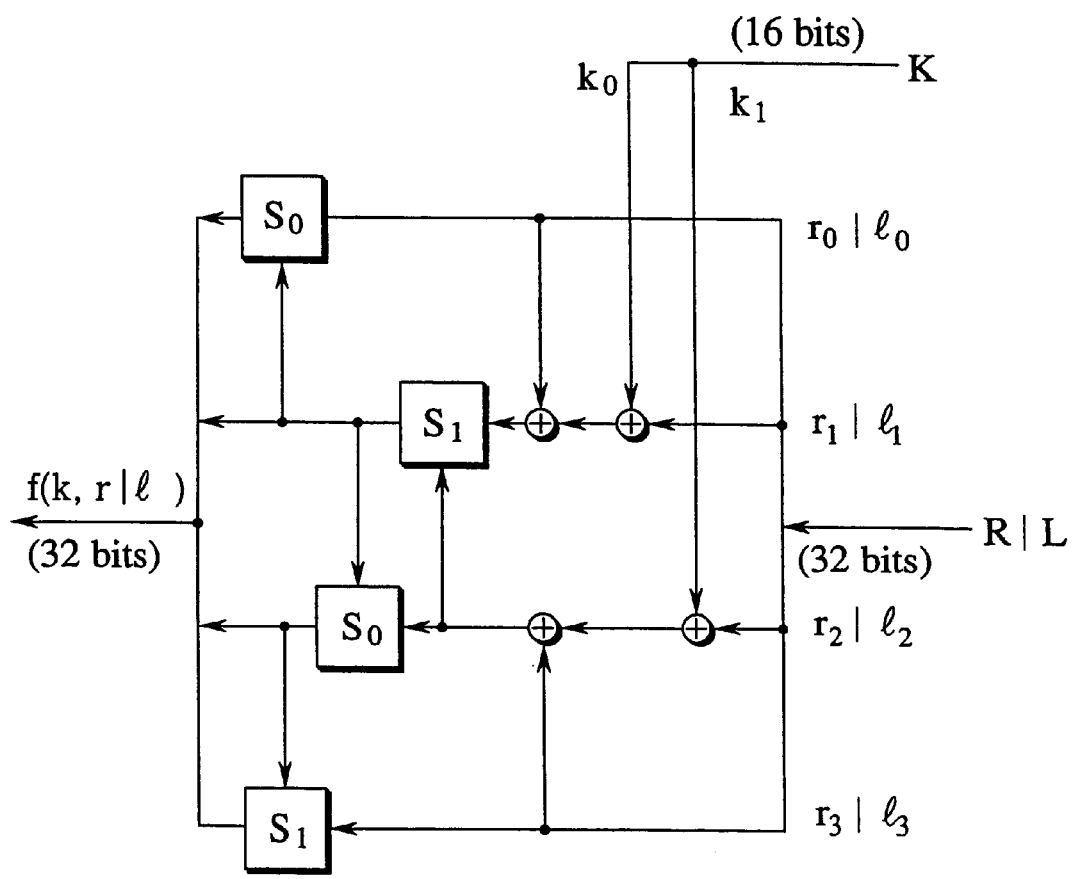
FIG. 8 shows a function-f unit in an encryption processing flow realized in the integrated circuit of the fourth embodiment.
Figure 9:
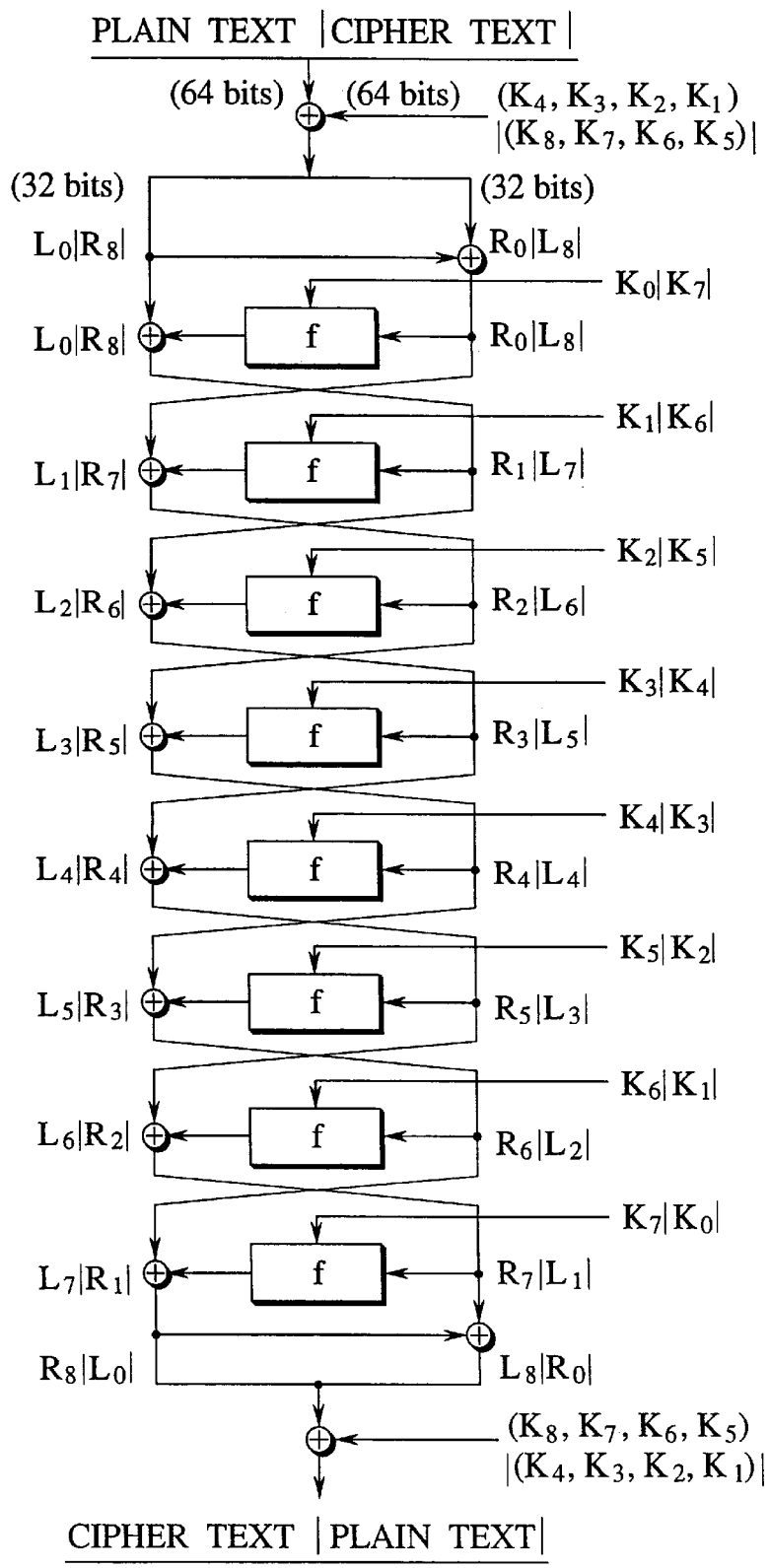
FIG. 9 shows the encryption processing flow involving function-f units each being equivalent to the function-f unit of FIG. 8, for converting a plain text into a cipher text and a cipher text into a plain text with the use of the expanded keys.

FIG. 6 shows a function-fk unit in a key processing flow realized in the integrated circuit of the fourth embodiment. This key processing flow creates an expanded key from a FEAL-8 encryption key. FIG. 7 shows the key processing flow involving function-fk units each being equivalent to the function-fK unit of FIG. 6. FIG. 8 shows a function-f unit in an encryption processing flow realized in the integrated circuit of the fourth embodiment. This encryption processing flow converts a plain text into a cipher text and a cipher text into a plain text with the use of the expanded keys. FIG. 9 shows the encryption processing flow involving function-f units each being equivalent to the function-f unit of FIG. 8.

The key processing flow and encryption processing flow repeat the function-fk and function-f eight times each, to deepen the randomness of data and enhance the security of encryption. The number of times of repetition is equal to the number of stages.

In FIGS. 7 and 9, each unit divides 64-bit data into two pieces of 32-bit data. In FIG. 6, the function-fK unit divides 32-bit data A (B) into 8-bit data α 0, α 1, α 2, and α 3 (β 0, β 1, β 2, and β 3). In FIG. 8, the function-f unit divides 32-bit data R (L) into 8-bit data r0, r1, r2, and r3 (10, 11, 12, and 13). 16-bit data K is divided into 8-bit data k0 and k1. In this way, every data is divided into 8-bit data on which further operations are carried out.

In FIGS. 6 and 8, a circled "+" indicates a bit-by-bit exclusive OR operation carried out on two pieces of 8-bit data. If 8-bit data of bits d10 to d17 and 8-bit data of bits d20 to d27 are received, an exclusive OR of the bits d10 and d20, an exclusive OR of the bits d11 and d21, . . . , and an exclusive OR of the bits d17 and d27 are executed. A function Si (i=1 or 0) adds two pieces of 8-bit data to each other, adds i to the sum, and cyclically shifts the resultant data to the left by two bits.

The details of FEAL-8 will not be explained. Any encryption is exposed to deciphering attacks. Accordingly, the encryption circuit should be reconfigured periodically or whenever an encrypted text is transmitted, to change encryption processing and enhance security.

The integrated circuit of the fourth embodiment is based on the third embodiment to achieve the key processing flow and encryption processing flow. The integrated circuit of the fourth embodiment can be reconfigured by changing the configurations of CLBs, connections among CLBs and HLBs, and connections among partial circuits made of CLBs and HLBs. The wiring of the CLBs or data connections among the CLBs and HLBs of the fourth embodiment may partly or entirely be changed to change the encryption processing and strengthen the security.

The first to eighth stages of FIGS. 7 and 9 may be realized with separate circuits or by repeatedly using circuits each involving a small number of stages, for example, one, two, or four stages. This is possible because the eight stages carry out similar operations. For example, a circuit involving a single stage may be executed eight times, or a circuit involving two stages four times, or a circuit involving four stages twice, to finish the eight-stage operations. CLBs need larger space than HLBs. When many CLBs are used, it is preferable to repeatedly use circuits each having a small number of stages.

The controller 373 (FIG. 5) synchronizes operations carried out by the HLBs and CLBs, controls the number of times of repetition of the partial circuits C1 to C8, and selects expanded keys K0 to K15 provided by the function-fK units for the function-f units.

The fourth embodiment processes 8-bit data units. Namely, the fourth embodiment divides input data into 8-bit groups and carries out the same processes on the first to eighth bits of a given group. To achieve this, the fourth embodiment provides given eight CLBs with common configuration data from the SRAM 313, to configure the eight CLBs to achieve the same function. This reduces the number of configuration data memories to one eighth of the prior art, thereby improving the packaging density of the integrated circuit.

If possible, the CLBs will be replaced with HLBs to reduce the area occupied by the logic blocks to one tenth or below of the prior art, to further improve the packaging density.

The operation speed of HLBs is about 10 times faster than that of CLBs. Accordingly, replacing the CLBs with HLBs will improve the operation speed of the integrated circuit.

The improved packaging density enables the eight stages of FIGS. 7 and 9 to be easily laid out in the integrated circuit.

One partial circuit corresponds to one stage of FIGS. 7 or 9. An integrated circuit having a single stage (a single partial circuit) may be executed eight times to finish the eight-stage operation.

Each of eight partial circuits (C1 to C8) may be executed one time to finish the eight-stage operation. For example, C1 is used for the first stage operation, C2 for the second stage operation, . . . , and C8 for the eighth stage operation. Then, while the second stage is processing data bits d0 to d7 that have finished the first stage, the first stage may process the next data bits d8 to d15. This improves processing performance eight times higher than the integrated circuit having a single stage that must be repeated eight times.

The configuration data memory (313 of FIG. 5) may be an SRAM, an FRAM (ferroelectric random access memory), or any other element capable of reading, writing, and storing data. Nonvolatile memories such as FRAMs are capable of holding configuration data even after a power source is cut, and therefore, are useful for such applications that assume frequent power cuts.

Figure 10:
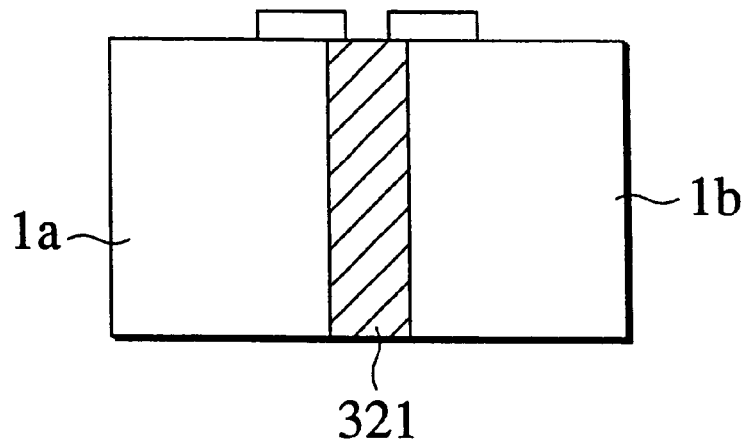
FIG. 10 roughly shows an integrated circuit having CLBs according to a fifth embodiment of the present invention.

FIG. 10 roughly shows an integrated circuit according to the fifth embodiment of the present invention. Two CLBs 1a and 1b share a memory 321 that stores configuration data.

The same configuration data, i.e., the same signal is supplied from the memory 321 to the CLBs 1a and 1b. As a result, in each of the CLBs 1a and 1b, multiplexers select identical signals and are connected in the same manner. For example, the CLBs 1a and 1b serve each as a NAND logic block. The CLBs 1a and 1b that share the memory 321 may receive different input data, or the output of one of them may be supplied to an input of the other.

The CLBs 1a and 1b are symmetrical with respect to the memory 321. This arrangement equalizes the wiring resistance and lengths of the CLBs 1a and 1b, and therefore, is easy to lay out when designing an integrated circuit.

Figure 11A:
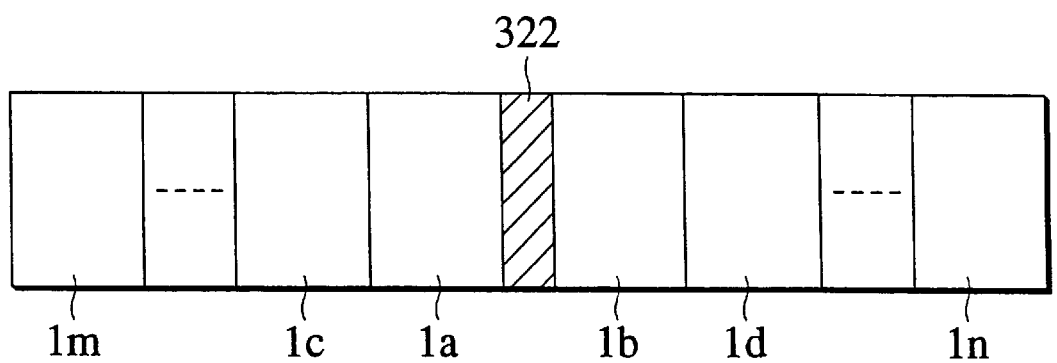
FIGS. 11A and 11B roughly show integrated circuits having CLBs according to a sixth embodiment of the present invention.
Figure 11B:
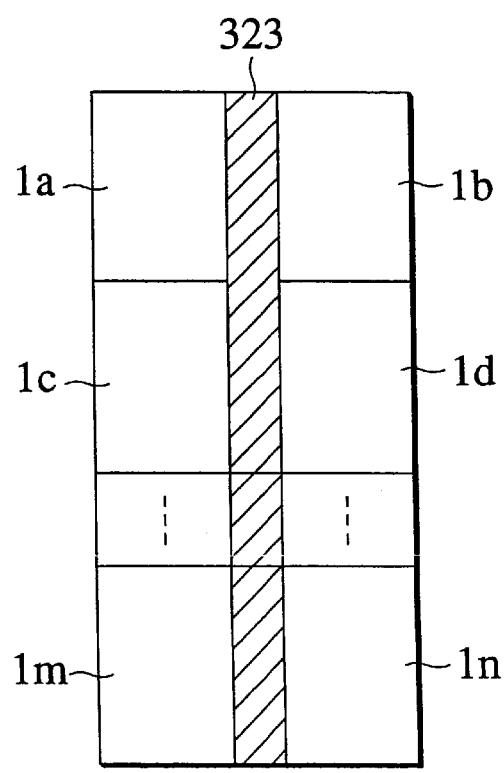

FIGS. 11A and 11B roughly show integrated circuits according to the sixth embodiment of the present invention.

In FIG. 11A, CLBs 1a and 1b, 1c and 1d, . . . , and 1m and 1n are symmetrical with each other on the opposite sides of a memory 322 that stores configuration data shared by the CLBs. The number "n" of the CLBs is optional.

In FIG. 11B, CLBs 1a and 1b, 1c and 1d, . . . , and 1m and 1n are linearly arranged along a memory 323 and are symmetrical with each other on the opposite sides of the memory 323. All of the CLBs are in contact with the memory 323. The memory 323 stores configuration data shared by the CLBs. The number "n" of the CLBs is optional.

The same configuration data, i.e., the same signal is supplied from the memory 322 (323) to the CLBs 1a to 1n. Accordingly, in each of the CLBs, multiplexers select identical signals and are connected in the same manner. As a result, all of the CLBs provide the same function. For example, the CLBs 1a to 1n serve each as a NAND logic block. The CLBs may receive different input data, or the output of one of them may be connected to an input of another.

Since the CLBs 1a to 1n are symmetrical with respect to the memory 322 (323), the symmetrical CLBs, e.g., 1a and 1b have the same wiring resistance and delay. This arrangement is easy to lay out when designing an integrated circuit.

The sixth embodiment is capable of reducing the number of memories used by CLBs to 1/n of the prior art.

Figure 12:
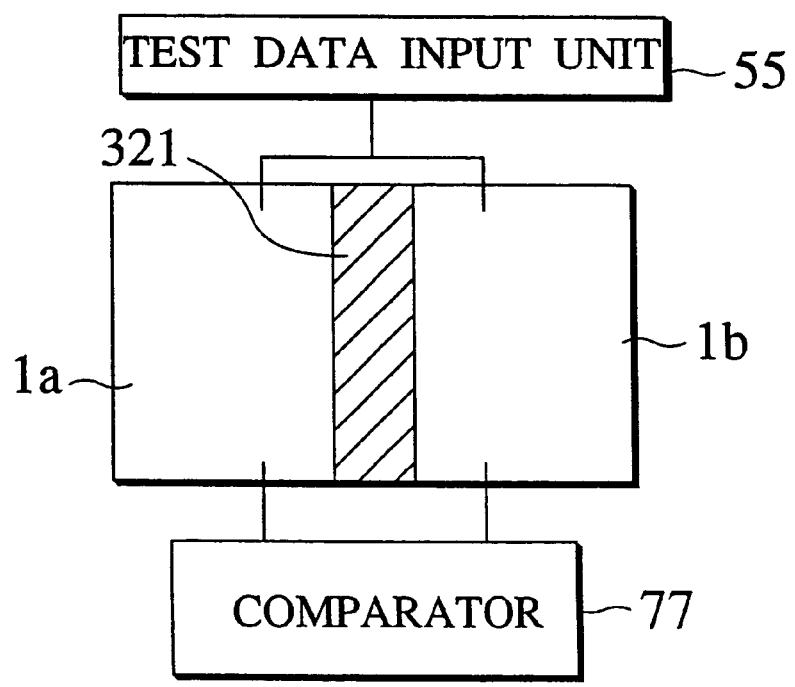
FIG. 12 explains a method of testing an integrated circuit having CLBs according to a seventh embodiment of the present invention.

FIG. 12 explains a method of testing an integrated circuit, according to the seventh embodiment of the present invention. CLBs 1a and 1b are connected to a test data input unit 55 and a comparator 77 for comparing operation results provided by the CLBs 1a and 1b with each other.

A memory 321 provides the CLBs 1a and 1b with the same configuration data. The input unit 55 provides the CLBs 1a and 1b with the same test data. The CLBs 1a and 1b process the test data and provide results, which are compared with each other by the comparator 77.

Since the CLBs 1a and 1b receive the same configuration data, they serve each as the same logic block. Since they receive the same test data, operation results provided by them must be equal to each other. If the comparator 77 determines that the operation results are different from each other, one of the CLBs 1a and 1b is defective.

The seventh embodiment easily determines whether or not tested CLBs are sound and greatly reduces testing work compared with the prior art. The prior art must prepare an output data pattern for an input data pattern, compare the output data pattern with actual output data, and determine whether or not tested CLBs are correct. This testing work is complicated. The seventh embodiment simply determines whether or not the outputs of tested CLBs that share a configuration memory are equal to each other, to greatly simplify the testing work.

The test data input unit 55 may generate random numbers to automatically prepare test data, which is commonly supplied to the CLBs 1a and 1b. The comparator 77 compares operation results provided by the CLBs 1a and 1b with each other, to determine whether or not the results are equal to each other. This method automatically prepares test data to be supplied to the CLBs 1a and 1b, to greatly simplify the testing work.

Figure 13A:
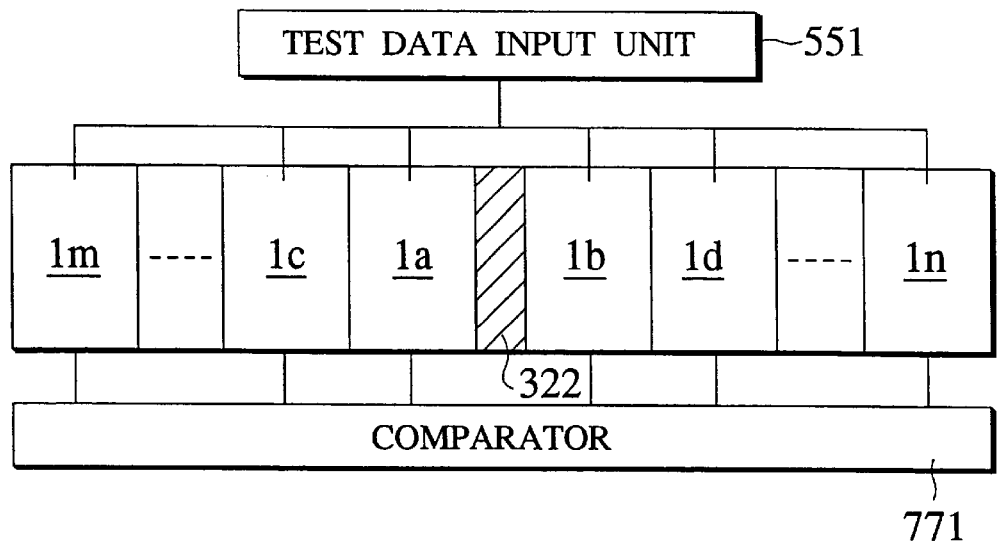
FIGS. 13A and 13B explain methods of testing an integrated circuit according to an eighth embodiment of the present invention.
Figure 13B:
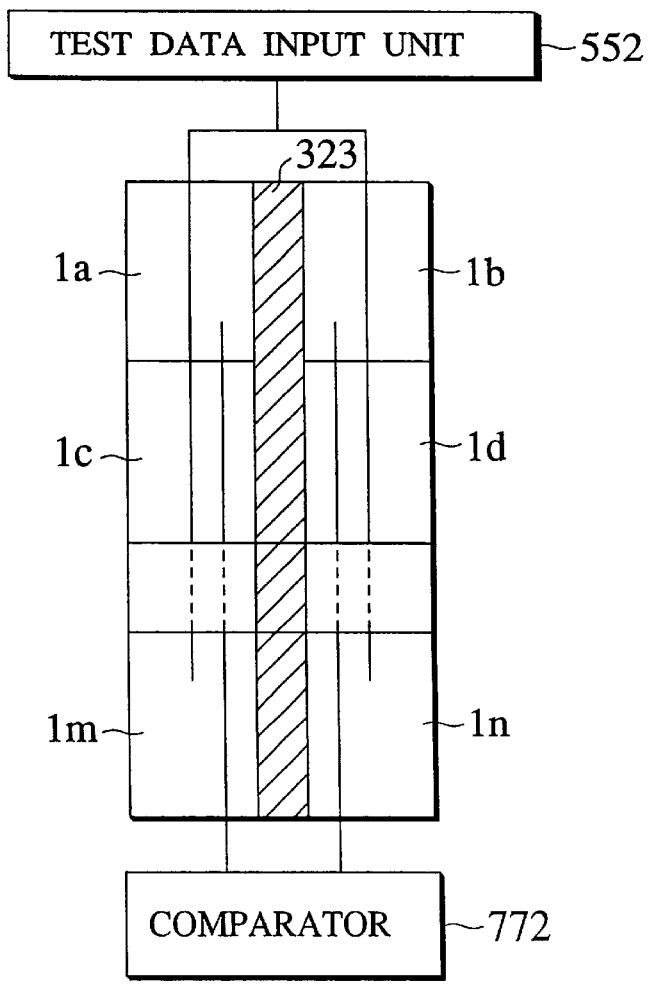

FIGS. 13A and 13B explain methods of testing an integrated circuit according to the eighth embodiment of the present invention. A test data input unit 551 (552) and a comparator 771 (772) for comparing operation results with each other are connected to CLBs 1a to 1n.

A memory 322 (323) provides the CLBs 1a to 1n with the same configuration data. The test data input unit 551 (552) provides the CLBs 1a to in with the same test data. The CLBs 1a to 1n process the test data and provide operation results. The comparator 771 (772) compares the results with one another and provides a comparison result.

Since the same configuration data and the same test data are supplied to the CLBs 1a to 1n, the operation results provided by them must be equal to one another. If any one of the results is different from the others, the corresponding CLB is abandoned or disabled as defective so that it will not be used.

The eighth embodiment easily tests CLBs to greatly simplify the testing work compared with the prior art. The prior art must prepare an output data pattern for an input data pattern, compare the output data pattern with actual output data, and determine whether or not tested CLBs are correct. This testing work is complicated. The eighth embodiment simply determines whether or not the outputs of tested CLBs that share a configuration memory are equal to one another, thereby greatly simplifying the testing work.

Not only automatically determining whether or not operation results of tested CLBs are correct, the eighth embodiment also identifies defective CLBs and disables them so that they are not used. As a result, an integrated circuit that contains some defective CLBs can be used by disabling the defective CLBs, to improve the yield of integrated circuits and reduce the costs thereof.

The test data input unit 551 (552) may generate random numbers to automatically prepare test data so that the test data may commonly be supplied to the CLBs 1a to 1n. The comparator 771 (772) compares operation results provided by the CLBs 1a to 1n with one another and determines whether or not the results are correct. This method automatically prepares test data to be supplied to the CLBs 1a to 1n, to eliminate a testing circuit and greatly simplify the testing work.

Various modifications will become possible for those skilled in the art after receiving the teachings of the present disclosure without departing from the scope thereof.

What is claimed is:

1. An integrated circuit comprising:
   hard-wired logic blocks configured to carry out fixed operations;
   connections between the hard-wired logic blocks, said connections configured to receive selection signals to determine if they connect to the hard-wire logic blocks; and
   a memory configured to store block-connection data for determining the connections between the hard-wired logic blocks,
   the connections between the hard-wired logic blocks being reconfigurable according to the block-connection data,
      wherein the hard-wired logic blocks are selected from the group consisting of:
         adder circuits and exclusive OR circuits.

2. The integrated circuit of claim 1, wherein the block-connection data further comprise a connection sequence of the hard-wired logic blocks, said connection sequence of hard-wired logic blocks defining logic-block sets, and the logic-block sets sharing the block-connection data.

3. The integrated circuit of claim 2, wherein the block connection data further comprise:
   a group connection including two or more of the connection sequences and defining a partial circuit; and
   a partial circuit connection defining a connection between partial circuits.

4. The integrated circuit of claim 1, further comprising a controller connected to the memory and configured to change the connections between the hard-wired logic blocks.

5. An integrated circuit comprising:
   configurable logic blocks that are reconfigurable;
   hard-wired logic blocks configured to carry out fixed operations;
   connections amongst and between the configurable logic blocks and the hard-wired logic blocks, said connections configured to receive selection signals to determine if they connect; and
   a memory configured to store configuration data for configuring the configurable logic blocks and block connection data for determining connections between any two individual blocks of the configurable logic blocks and the hard-wired logic blocks, the configurable logic blocks being reconfigurable according to the configuration data, the connections amongst and between any two individual blocks of the configurable logic blocks and the hard-wired logic blocks being reconfigurable according to the block-connection data,
      wherein the hard-wired logic blocks are selected from the group consisting of:
         adder circuits and exclusive OR circuits.

6. The integrated circuit of claim 5, wherein the block-connection data further include a connection sequence of individual blocks of the configurable logic blocks and hard-wired logic blocks, said connection sequence defining logic-blockset sets, the logic-block sets sharing the configuration data and block-connection data.

7. The integrated circuit of claim 6, wherein the block-connection data further include;
   a group connection including two or more the connection sequences and defining a partial circuit; and
   a partial-circuit-connection defining a connection between partial circuits.

8. The integrated circuit of claim 5, further comprising a controller connected to the memory and configured to change the connections amongst and between the configurable logic blocks and the hard-wired logic blocks.

9. An integrated circuit for encryption, comprising:
   a key processing circuit; and
   an encryption processing circuit;
   at least one of said circuits including
   hard-wired logic blocks configured to carry out fixed operations,
   connections between the hard-wired logic blocks, said connections configured to receive selection signals to determine if they connect the hard-wired logic blocks, and
   a memory configured to store block-connection data for determining the connections between the hard-wired logic blocks,
   the connections between the hard-wired logic blocks being reconfigurable according to the block-connection data,
      wherein the hard-wired logic blocks are selected from the group consisting of:
         adder circuits and exclusive OR circuits.

10. The integrated circuit of claim 9, wherein the block connection data further include a connection sequence of the hard-wired logic blocks, said connection sequence of hard-wired logic blocks defining logic-block sets, the logic-block sets sharing the block connection data.

11. The integrated circuit of claim 10, wherein the block-connection data further include:
   a group connection including two or more sequences of connections and defining a partial circuit; and
   a partial-circuit-connection defining a connection between partial circuits.

12. The integrated circuit of claim 9, further comprising a controller connected to the memory and configured to change the connections amongst and between the configurable logic blocks and the hard-wired logic blocks.

13. An integrated circuit for encryption, comprising:
   a key processing circuit; and
   an encryption processing circuit;
   at least one of said circuits including
   configurable logic blocks that are reconfigurable,
   hard-wired logic blocks configured to carry out fixed operations, connections amongst and between the configurable logic blocks and the hard-wired logic blocks, and a memory configured to store configuration data for configuring the configurable logic blocks and the block connection data for determining connections between any two individual blocks of the configurable logic blocks and the hard-wired logic blocks, the connections between any two individual blocks of the configurable logic blocks and the hard-wired logic blocks being reconfigurable, wherein the hard-wired logic blocks are selected from the group consisting of:

adder circuits and exclusive OR circuits.

14. The integrated circuit of claim 13, wherein the block-connection data further include a connection sequence of any of the configurable logic blocks and hard-wired logic blocks, said connection sequence of configurable logic blocks and hard-wired logic blocks defining logic-block sets, the logic-block sets sharing the configuration data and block-connection data.

15. The integrated circuit of claim 14, wherein the block-connection data further include:

a group connection including two or more sequences of connections and defining a partial circuit; and a partial-circuit-connection defining a connection between partial circuits.

16. A method of testing an integrated circuit having configurable logic blocks that are reconfigurable, comprising:

providing first and second configurable logic blocks with the same configuration data from a same configuration memory that stores configuration data in order to place the first and second configurable logic blocks in the same state;

providing the first and second configurable logic blocks, each of which coupled with a test data input, with the same test data from the test data input unit;

comparing a first output of the first configurable logic block with a second output of the second configurable logic block using a comparator; and determining that one of the first and second configurable logic blocks is defective if the first output is different from the second output.

* * * * *